United States Patent [19]

Buhr et al.

[11] 4,421,844
[45] Dec. 20, 1983

[54] PROCESS FOR THE PREPARATION OF RELIEF COPIES

[75] Inventors: Gerhard Buhr, Koenigstein; Marie-Luise Geus, Wiesbaden, both of Fed. Rep. of Germany

[73] Assignee: Hoechst Aktiengesellschaft, Frankfurt am Main, Fed. Rep. of Germany

[21] Appl. No.: 310,276

[22] Filed: Oct. 9, 1981

[30] Foreign Application Priority Data

Oct. 13, 1980 [DE] Fed. Rep. of Germany ....... 3038605

[51] Int. Cl.³ ........................... G03C 5/24; G03F 7/00
[52] U.S. Cl. .................................. 430/326; 430/309; 430/328; 430/330; 430/945; 430/296; 430/967; 430/176; 430/192
[58] Field of Search ............... 430/330, 326, 945, 328, 430/309, 296

[56] References Cited

U.S. PATENT DOCUMENTS

| | | |
|---|---|---|
| 3,529,966 | 9/1970 | Herrmann et al. . |
| 3,697,274 | 10/1972 | Herrmann . |
| 3,726,679 | 4/1973 | Abolafia et al. ................. 96/43 HD |
| 3,779,778 | 12/1973 | Smith et al. . |
| 3,915,706 | 10/1975 | Limburg et al. ..................... 96/27 R |
| 4,101,323 | 7/1978 | Buhr et al. . |
| 4,247,611 | 1/1981 | Sander et al. ....................... 430/286 |
| 4,250,247 | 2/1981 | Sander et al. . |

FOREIGN PATENT DOCUMENTS

| | | |
|---|---|---|
| 5775 | 12/1979 | European Pat. Off. . |
| 2171724 | 8/1973 | France . |
| 1212260 | 2/1971 | United Kingdom . |

OTHER PUBLICATIONS

IBM Technical Disclosure Bulletin, vol. 13, No. 2, Jul. 1970.

*Primary Examiner*—Charles L. Bowers, Jr.
*Attorney, Agent, or Firm*—Schwartz, Jeffery, Schwaab, Mack, Blumenthal & Koch

[57] ABSTRACT

Disclosed is a process for the preparation of relief copies, comprising the steps of imagewise irradiating a radiation-sensitive copying material comprising a layer support and a radiation-sensitive layer comprising (a) a compound which upon irradiation splits off acid, and (b) a compound possessing at least one acid-cleavable C—O—C group; heating the imagewise irradiated copying material to a temperature above room temperature for a period of time sufficient to produce an increase in radiation sensitivity of the radiation-sensitive layer; and washing out the irradiated layer areas by means of a developer.

9 Claims, No Drawings

PROCESS FOR THE PREPARATION OF RELIEF COPIES

BACKGROUND OF THE INVENTION

The present invention relates to a process for the preparation of relief copies by imagewise irradiating a positive-working, light-sensitive copying material which is composed of a layer support and a radiation-sensitive layer, and washing out the irradiated layer areas. The radiation-sensitive layer contains a compound which upon irradiation splits off acid and a compound which has at least one acid-cleavable C—O—C group.

Copying materials of this general type are known and are, e.g., described in U.S. Pat. Nos. 3,779,778 and 4,101,323; in German Pat. No. 27 18 254 and in German Offenlegunsschriften Nos. 28 29 512 and 28 29 511. The acid-cleavable compounds contained therein are orthocarboxylic acid derivatives, monomeric or polymeric acetals, enolethers or acyliminocarbonates. The radiation-sensitive compounds contained therein which split off acid predominantly are organic halogen compounds, especially s-triazines which have been substituted by halogenomethyl groups.

The radiation-sensitivity, and in particular the sensitivity to long-wave ultraviolet light, of these compositions is considerably increased compared with other industrially employed positive systems, such as, e.g., o-quinone diazides.

It has been found, however, that the radiation sensitivity of the copying materials based on acid-cleavable compounds to a certain extent depends on the time which elapses between the exposure and developing, i.e., the maximum practical sensitivity is only obtained when some minutes are allowed to elapse between exposure and developing. In case of a storage time of about 3 minutes between exposure and developing, the practical sensitivity to light typically increases by up to 1.5 wedge steps, i.e., about 70% compared with the value which is measured when the time interval between exposure and developing is only 15 seconds. When this time interval is extended to about 5-40 minutes, constant sensitivity values are obtained.

In order to obtain high constant sensitivity values, it is therefore advisable to wait after the exposure for at least 5-10 minutes before developing is carried out. Thus the time saved due to the high sensitivity to light is largely lost during the processing.

In the case of continuously proceeding treatment processes such as, e.g., the preparation of printing forms, it is possible to store the exposed plates in a holder, from which they are removed and developed after a predetermined time. If a large number of plates are to be prepared, this delay occurs only once, at the beginning, and is of minor importance, but such a holder is of a complicated constructional design and requires much floor space. Moreover, in case of a continuous-operation service, there is always the danger that exposure deficiencies are discovered only after a large number of plates have been subjected to this incorrect exposure. Besides, it is also desired to reduce this time required in advance when single plates are processed, so that the total treatment can be carried out within the time otherwise required.

SUMMARY OF THE INVENTION

It is therefore an object of the present invention to provide an improved process for producing relief copies.

A further object of the invention is to provide a process for the preparation of relief images which are provided with a radiation-sensitive material of the kind described above, where practically no waiting time is necessary between irradiation and developing.

It is also an object of the invention to provide a process for preparing such relief images wherein a high radiation-sensitivity is obtained which is independent of the waiting time.

In accomplishing the foregoing objects, there has been provided in accordance with the present invention a process for the preparation of relief copies, comprising the steps of imagewise irradiating a radiation-sensitive copying material comprising a layer support and a radiation-sensitive layer comprising (a) a compound which upon irradiation splits off acid, and (b) a compound possessing at least one acid-cleavable C—O—C group; heating the imagewise irradiated copying material to a temperature above room temperature for a period of time sufficient to produce an increase in radiation sensitivity of the radiation-sensitive layer; and washing out the irradiated layer areas by means of a developer. Preferably, the imagewise irradiated copying material is heated for a period of from about 0.5 to 2 minutes at a temperature in a range of between about 40° and 130° C.

Further objects, features and advantages of the present invention will become apparent from the detailed description of preferred embodiments which follows.

DETAILED DESCRIPTION OF PREFERRED EMBODIMENTS

In accordance with the invention, the process for the preparation of relief copies involves imagewise irradiating a radiation-sensitive copying material comprising a layer support and a radiation-sensitive layer containing:

(a) a compound which upon irradiation splits off acid, and (b) a compound possessing at least one acid-cleavable C—O—C group, and washing out the irradiated layer areas by means of a developer. The process is characterized in that the imagewise irradiated copying material is heated for a short time before the washing-out step.

It is known to heat printing plates between their exposure and development. German Pat. Nos. 14 47 913 and 16 71 626 and German Offenlegunsschrift No. 23 42 068, e.g., describe negative working light-sensitive materials containing compounds which upon exposure form acids, and compounds which can be cross-linked or cured by acids, in most cases acid-curable condensation resins. In general, heating is hereby indispensible in order to achieve a sufficient image differentiation within a reasonable time.

There are also known positive working materials, i.e., materials which become soluble in their exposed areas, where heating is carried out after the exposure in order to achieve an image differentiation. German Pat. No. 15 22 495 describes layers of acid-curable resins and iodine or alkali iodides where, through heating, the unexposed areas are more strongly cured than the exposed areas.

In European Published Application No. 0,005,775 positive working photoresist materials are disclosed, the mode of reaction of which is based on another mechanism. Here the radical depolymerization of insoluble layer constituents which is initiated by electron irradiation, is accelerated by heating, and the depolymerization products are evaporated. Heating hereby is carried out for up to about 30 minutes. In accordance with German Offenlegunsschrift No. 29 45 630, too, the depolymerization of certain polymers is completed by heating to 120°–170° C. for at least 30 minutes.

In the compounds which are employed in accordance with the process proposed by the instant invention, the solubilizing reaction proceeds completely differently. The acid produced by the action of actinic irradiation protonises the acid-cleavable compounds and thereby, either directly or after splitting off of a reaction product, such as, e.g., a molecule of alcohol or phenol, creates a reactive intermediate compound which adds water and finally is converted into the end products of hydrolysis.

There are certain features which are common to this reaction mechanism and the photoreaction of o-naphthoquinone diazides, which are the positive working compounds most often used industrially. Here, too, a reactive intermediate compound, a ketene, is formed upon exposure, which by an ionic mechanism adds water and is converted into an alkali-soluble indene carboxylic acid. This process takes place very fast, however, and cannot be accelerated by a heat treatment between exposure and development. For this reason, it has been particularly surprising that in the light-sensitive systems employed in accordance with this invention, the formation of soluble products can be accelerated by heating.

The way in which the heat is applied can to a large extent be freely chosen. Thus, the heat may be conducted through the layer support of the copying material, e.g., by means of a heated plate or roller, or, alternatively, it may be conducted by means of a gaseous heat transfer medium, e.g., in a circulating air drying oven. Also advantageous is the action of infrared irradiation or of other types of electromagnetic irradiation of wave lengths beyond the activating range of the compound which splits off acid. The only essential point is to raise the temperature of the irradiated copying layer to values clearly exceeding room temperature. In general, the layer should reach a temperature in the range between about 40° C. and 130° C. The preferred range lies between about 50° and 100° C., with special preference being given to temperatures of between about 65° and 90° C.

Temperatures below 40° C. in general do not suffice to initiate a satisfactory acceleration of the solubilizing reaction, whereas temperatures which are markedly higher than 130° C. quite often adversely influence the reproduction of very fine image elements. It is assumed that in this case even the unexposed layer is modified by the action of heat.

The heating step should advantageously last for about 0.5 to 2 minutes.

As already mentioned above, the light-sensitive compositions used in the process according to this invention are known. Suitable compositions, which are based on acid-cleavable compounds are described in the publications mentioned at the beginning, the disclosures of which are hereby incorporated by reference.

Of the orthocarboxylic acid derivatives described in U.S. Pat. No. 4,010,323, preference is given to the diphenoxy methyl ethers of aliphatic or aromatic hydroxy compounds, the N-diphenoxy methyl derivatives of lactams, and especially to the bis-1,3-dioxan-2-yl-ethers of aliphatic diols.

The polyacetals disclosed in German Pat. No. 27 18 254 (which is equivalent to U.S. Pat. No. 4,247,611) are organic polymeric compounds which contain recurrent acetal or ketal groupings in the main chain and whose solubility in a developer liquid is increased by the action of an acid. These polymeric compounds are polyaddition and/or polycondensation products obtained by reaction of aldehydes and/or ketones with bivalent alcohols. In the copying compositions according to the disclosed invention, each alpha-carbon atom of the alcoholic constituent of the acetal or ketal groupings of the organic polymeric compound is aliphatic.

Of the polyacetals described in German Pat. No. 27 18 254, those with aliphatic aldehyde or diol units are preferred.

Further suitable compositions are mentioned in German Patent Application No. P 29 28 636.0, the disclosure of which is also incorporated by reference herein. Therein, polymeric orthocarboxylic acid esters having recurring orthocarboxylic acid ester groups in their main chains are described. One preferred ester of this type is the polymeric orthocarboxylic acid ester product by condensing trimethyl orthoformate with 4-oxa-6,6-bis-hydroxy methyl octan-1-ol.

These groups are 2-alkyl ethers of 1,3-dioxacycloalkanes with 5 or 6 ring members. Especially preferred are polymers with recurring 1,3-dioxacyclohex-2-yl-alkyl ether units, wherein the alkyl ether group may be interruped by etheric oxygen atoms and preferably is bound to the 5-position of the neighboring ring. Some of these polymeric orthocarboxylic acid esters are also described in German Offenlegungsschrift No. 27 15 502, the disclosure of which is also incorporated by reference herein.

The quantitative proportion of the acid-cleavable compounds in the light-sensitive composition in general lies between about 8 and 65%, preferably between about 14 and 44% by weight, relative to the non-volatile constituents of the composition.

The compositions preferably further contain a polymeric, preferably water-insoluble binder which is soluble in organic solvents.

Since the developer liquids which can be used for developing the exposed copying layers advantageously are aqueous-alkaline solutions, and these generally are preferred to developers based on organic solvents, special preference is given to binders which are soluble or at least swellable in aqueous alkali solutions.

Depending on their intended use, various types and quantities of water-insoluble binders can be employed. Quantities between about 30 and 90%, and especially between about 55 and 85% by weight, relative to total solids content, are preferably used.

The phenolic resins, and above all novolaks, which have been successfully used with a great number of positive copying materials, have proved to be particularly suitable and advantageous in the compositions employed in this invention, too. They foster a strong differentiation between the exposed and the unexposed layer parts on developing, especially the more highly condensed resins which have substituted phenols, e.g., cresols, as their formaldehyde condensation partners. The novolaks may also be modified in the known manner by reacting part of their hydroxy groups, e.g., with chloroacetic acid, isocyanates, epoxides or carboxylic acid anhydrides. Other alkali-soluble resins, such as copolymers of maleic anhydride and styrene, vinyl acetate and crotonic acid, methyl methacrylate and methacrylic acid and the like are also suitable as binders.

In addition to these, many other resins may be used, which can be water-soluble or alkali-insoluble, and preferably are vinyl polymers, such as polyvinyl acetates, polyacrylates, polyvinyl ethers and polyvinyl pyrrolidones, which may be modified by comonomers. The most advantageous proportion of these resins depends on the technological requirements and on the influence on the developing conditions and in general amounts to at most about 20% of the alkali-soluble resin. To meet special requirements, such as flexibility, adhesion, gloss, etc., the light-sensitive layer may additionally contain small quantities of substances such as polyglycols, cellulose ethers, e.g., ethyl cellulose, surfactants, dyes and fine-particle pigments.

As the radiation sensitive components which upon irradiation preferably form or split off strong acids, a great number of known compounds and compositions are suitable, such as diazonium, phosphonium, sulfonium and iodonium salts, halogen compounds, o-quinone diazide sulfochlorides and organo-metallic-organohalogen combinations.

In general, the mentioned diazonium, phosphonium, sulfonium and iodonium compounds are employed in the form of their salts which are soluble in organic solvents and which in most cases are the separation products of the reaction with complex acids, such as fluoroboric acid, hexafluorophosphoric acid, hexafluoroantimony acid and hexafluoroarsenic acid.

Principally, all organic halogen compounds which are known as photochemical radical initiators, e.g., those wherein more than one halogen atom are bonded to a carbon atom or to an aromatic ring, can be used as the radiation-sensitive compounds which contain halogens and form hydrohalogenic acids. Examples of them are described U.S. Pat. Nos. 3,515,552; 3,536,489 and 3,779,778; in German Pat. No. 26 10 842 and in German Offenlegunsschriften Nos. 27 18 259 and 22 43 621. Of these compounds, preference is given to the s-triazine derivatives having two halogenomethyl groups, in particular trichloromethyl groups, and an aromatic substituent on the triazine nucleus, as they are described in German Offenlegunsschrift No. 27 18 259. By means of known sensitizers, the action of these halogen containing compounds can be spectrally influenced and increased. The disclosures of the foregoing patents and published applications are also incorporated by reference herein.

Depending on the chemical nature of the initiator and the composition of initiator may be added. Good results are achieved with quantities of between about 0.1 and 10% by weight, preferably between about 0.2 and 5% by weight, relative to total solids. Particularly for copying layers having thicknesses of more than about 10 μm, it is recommended to use relatively little acid donor.

Finally, soluble or fine-particulate, dispersible dyes and, if appropriate, UV-absorbers, may be added to the light-sensitive composition. As dyes, triphenyl methane dyes, especially in the form of their carbinol bases, have proved particularly suitable. The most advantageous quantitiative proportions can be easily determined by performing preliminary tests in each case.

As the supports for the light-sensitive compositions, all materials are suitable which are commonly used in industrial copying processes. Examples of them are plastic films, copper-coated insulating plates, mechanically or electro-chemically roughened aluminum which optionally may be anodized, wood, ceramics, glass, and silicon the surface of which may be chemically reacted, e.g., into silicon nitride or silicon dioxide. In order to be suitable as a layer support, the support material must resist all undesired changes during the heating in accordance with the present invention.

In this description, irradiation means the action of actinic electromagnetic radiation of wave lengths below about 500 μm. Principally, all radiation sources emitting radiation within this range may be employed.

The use of laser equipment, in particular an automatic processing apparatus, wherein the radiation source is an argon ion laser, has proved especially advantageous. If profit is to be taken of the high-speed processing which in these apparatuses is possible due to the high light sensitivity of the material and to the capacity of the light source, it is necessary to interpose a heating step according to this invention. Of course, any other light source which usually is employed for copying processes may also be used.

The irradiation may also be carried out by means of electron beams. In this case it is also possible to use as the initiators of the solubilizing reaction compounds which split off acid but are not light-sensitive in a traditional sense. Examples of such compounds are halogenated aromatic compounds or halogenated polymeric hydrocarbons. X-rays may also be used for producing images.

The imagewise exposed or irradiated layer can be removed in the known manner with practically the same developers as naphthoquinone diazide layers and photoresists. The aqueous developer solutions may, e.g., contain alkali phosphates, alkali silicates or alkali hydroxides. Further, surfactants and optionally minor proportions of organic solvents may be contained therein. In certain cases, solvent-water mixtures may also be used as the developers. The most suitable developer can be selected by means of tests on the individually used layer. If necessary, the developing may be mechanically assisted.

The following examples are intended to illustrate the performance of the process according to this invention.

In the examples, parts by weight (p.b.w.) and parts by volume (p.b.v) have the same relationships as that of the g and the ccm. Percentage data and quantitative data are to be understood as weight units, unless otherwise stated.

EXAMPLE 1

A layer composed of
76.2 p.b.w. of cresol formaldehyde novolak (melting range 105°–120° C. acc. to DIN 53 181);
18.2 p.b.w. of bis-diphenoxy methyl ether of triethylene glycol;
1.4 p.b.w. of trihydroxybenzophenone;
3.6 p.b.w. of 2-(4-methoxy-naphth-1-yl)-4,6-bis-trichloromethyl-s-triazine; and
0.6 p.b.w. of crystal violet base
is applied to electrolytically roughened and anodized aluminum, to a thickness of about 2 μm, and exposed for 12 seconds under a 5 kW metal halide lamp through a continuous tone original with 13 steps of an optical density of 0.15 each, at a distance of 110 cm. After 30 seconds, developing is carried out with a developer of the following composition:
5.5 p.b.w. of sodium metasilicate×9 $H_2O$;

3.4 p.b.w. of trisodium phosphate×12 H$_2$O;
0.4 p.b.w. of sodium dihydrogen phosphate, anhydrous; and
90.7 p.b.w. of water.

The positive image has a solid step 5; step 2 shows very faint layer residues. The test is repeated in the same way, with the exception that a time of 10 minutes is allowed to elapse between exposure and development. A solid step 6 is obtained; step 3 is free from toning, which corresponds to a gain in sensitivity of about 40–50%. The same result is obtained when, between exposure and development, the layer is heated up to 80° C. in a drying cabinet for 50 seconds.

EXAMPLE 2

Example 1 is repeated, except the bis-orthoester used is replaced by equal quantities of bis-diphenoxy methyl ether of the bisphenol A and the layer is applied to brushed aluminum. The printing plate is exposed for 80 seconds under the conditions of Example 1, and 30 seconds thereafter developing is carried out with the developer of Example 1. A positive image is obtained which has a solid wedge step 5, whereas step 2 is almost free from toning. When a waiting time of 4 minutes takes place between exposure and developing, a solid step 6 and a clear step 4 is the result. This result can also be achieved by heating the layer for 1 minute to a temperature of 70° C.

EXAMPLE 3

A solution of
5.6 p.b.w. of cresol formaldehyde novolak, as described in Example 1;
0.8 p.b.w. of polyacetal of n-pentanal and triethylene glycol;
1.25 p.b.w. of the polyorthoester obtained by reacting 4-oxa-2-methyl-2-hydroxy methyl octane-1,8-diol with trimethyl orthoformate;
0.28 p.b.w. of 2-(acenaphth-5-yl)-4,6-bis-trichloromethyl-s-triazine;
0.05 p.b.w. of crystal violet base; and
0.12 p.b.w. of trihydroxy benzophenone in
30 p.b.w. of ethylene glycol monomethyl ether,
52.9 p.b.w. of tetrahydrofuran, and
9 p.w.b. of butyl acetate
is applied to aluminum plates, the surfaces of which have been electrochemically roughened, anodized and pretreated with a 0.1% aqueous solution of polyvinyl phosphonic acid. The layer is applied such that a dry layer thickness of 2.5 μm is obtained. The printing plate is exposed for 12 seconds under the conditions described in Example 1 and 30 seconds thereafter is developed with the developer of Example 1. When developing is carried out 10 minutes after the exposure, the unattacked and clear wedge steps are shifted by two units in the direction of a higher practical light sensitivity. On developing, the same copying result as with this plate, after storage at room temperature for 10 minutes, is achieved with a plate which after the exposure is passed, at a speed of 0.75 m per minute, through the approximately 30 cm long heating zone of a "Microcoater Model 9" by Gyrex Co., Santa Barbara, CA., U.S.A., which is equipped with long-wave infrared radiators, whereby a temperature of between 88° and 93° C. is measured on the underside of the plate by means of a commercial thermoindicator strip. When printing plates which have been exposed only heated in the abovedescribed manner are stored at room temperature for another 5, 10, or 20 minutes after the heating step, before they are developed, no difference in the copying results is observed, compared with plates developed immediately after the heating step.

The copying result obtained after a waiting time of only 30 seconds between exposure and developing is also observed after extended waiting times, when the exposed printing plates are stored at −26° C. for 5, 10, or 15 minutes before being developed. In those cases where, after the low-temperature storage, an adequately long waiting time at room temperature is allowed to pass or the plate is heated before being developed, the copying result corresponds to that obtained without the cooling-down phase.

EXAMPLE 4

A 1.7 μm thick layer of the following composition is applied to an aluminum plate with a mechanically roughened surface:
75 p.b.w. of novolak, as described in Example 1;
49 p.b.w. of chlorinated paraffin resin; and
21 p.b.w. of bis-(5-ethyl-5-butyl-1,3-dioxan-2-yl)ether of the 2-ethyl-2-butyl-propane-1,3-diol.

A square area of the plate surface, having a side length of 31.7 mm, i.e., a surface area of 10 cm$^2$, is irradiated line-by-line for 4 seconds, with electron beams of a current intensity of 5 μA at 11 kV. Ten minutes after the irradiation, the plate is dipped into the developer of Example 1 for 1 minute. The irradiated layer surface area is completely removed. When developing is carried out for 1 minute directly after the irradiation, without waiting for 10 minutes, the irradiated layer area is not dissolved away. When the plate is heated to 80° C. in a drying cabinet for one minute immediately after the irradiation, and then rapidly cooled down to room temperature again and developed, the irradiated layer area is immediately soluble, i.e., an irradiation with a charge density of 2 μC/cm$^2$ is sufficient for the solubilization.

EXAMPLES 5–9

Plates of aluminum which have been electrochemically roughened, anodized and pretreated with polyvinyl phosphonic acid are spin-coated with a solution of
5 p.b.w. of novolak, as described in Example 1;
1.5 p.b.w. of an acid-cleavable compound;
0.26 p.b.w. of acid donor; and
0.04 p.b.w. of crystal violet base in
93.2 p.b.w. of butan-2-one,
such that a layer thickness of about 1.8 μm results after drying. The plates are exposed under the conditions described in Example 1 and stored at room temperature for different periods of time, or additionally heated to 60° C. for 1 minute, before they are developed with a solution of
0.8 p.b.w. of sodium metasilicate×9 H$_2$O;
0.5 p.b.w. of sodium hydroxide; and
0.8 p.b.w. of n-butanol, in
97.9 p.b.w. of water.

In these cases, the expression "total time" in Table I means the total time which elapsed between exposure and developing, including the heating step.

The acid-cleavable compounds employed in Examples 5–9 are:
Example 5: 2-(4-(2,4-dichlorophenoxy)-phenoxy)-5,5-dimethyl oxazolin-4-one
Example 6: the bis-3,4-dihydronaphth-2-yl ether of 1,4-butane diol Example 7: the bis-3,4-dihydronaphth-2-yl ether of triethylene glycol Example 8: N-diphenoxy methyl-4-methyl acetidin-2-one Example 9: the bis-tetrahydropyran-2-yl ether of 4,4'-dihydroxy diphenyl sulfone In Examples 5–8, the acid donor is 2-(4-ethoxy-naphth-2-yl)-4,6-bis-trichloromethyl-s-triazine; in Example 9, the acid donor is 2-(4-methoxy styryl)-4,6-bis-trichloromethyl-s-triazine.

TABLE I

| Example | Exposure time (seconds) | Total time (seconds) | Heating 60 s/60 °C. | Wedge steps clear | solid from step |
|---|---|---|---|---|---|
| 5 | 12 | 14 | no | 0 | 4 |
|   |    | 600 | no | 2 | 6 |
|   |    | 75 | no | 0 | 5 |
|   |    | 75 | yes | 2 | 5 |
| 6 | 12 | 14 | no | 2 | 6 |
|   |    | 600 | no | 4 | 7 |
|   |    | 75 | no | 2 | 6 |
|   |    | 75 | yes | 4 | 7 |
| 7 | 12 | 14 | no | 0 | 3 |
|   |    | 600 | no | 2 | 5 |
|   |    | 75 | no | 0 | 4 |
|   |    | 75 | yes | 2 | 5 |
| 8 | 12 | 14 | no | 0 | 4 |
|   |    | 600 | no | 2 | 5 |
|   |    | 75 | no | 0 | 4 |
|   |    | 75 | yes | 2 | 4 |
| 9 | 40 | 14 | no | 1 | 6 |
|   |    | 600 | no | 3 | 7 |
|   |    | 75 | no | 1 | 6 |
|   |    | 75 | yes | 3 | 7 |

What is claimed is:

1. A process for the preparation of relief copies, comprising the steps of:
   imagewise irradiating a radiation-sensitive copying material comprising a layer support and a radiation-sensitive layer comprising
   (a) a compound which upon irradiation splits off acid, and
   (b) a compound possessing at least one acid-cleavable C—O—C group comprising an orthocarboxylic acid ester grouping or a carboxylic amide acetal grouping, or an organic polymeric compound containing recurring acetal or ketal groupings in the main chain and whose solubility in a developer liquid is increased by the action of an acid, wherein said polymeric compound is produced by reaction of an aldehyde and/or ketone with a bivalent alcohol and wherein each alpha-carbon atom of the alcohol constituent of the acetal or ketal groupings is aliphatic;
   after said irradiating step and before developing, heating the imagewise irradiated copying material to a temperature in the range of between 65° and 90° C. for a period of time sufficient to produce an increase in radiation sensitivity of the radiation-sensitive layer; and
   washing out the irradiated layer areas with a developer, after said heating step.

2. A process as claimed in claim 1, wherein the imagewise irradiated copying material is heated for a period of from about 0.5 to 2 minutes.

3. A process as claimed in claim 1, wherein the imagewise irradiation is performed by means of a laser beam.

4. A process as claimed in claim 1, wherein the irradiated layer areas are washed out with an aqueous-alkaline solution.

5. A process as claimed in claim 1, wherein the compound, which upon irradiation splits off acid, comprises an s-triazine derivative containing two halogenoalkyl groups and an aryl group as the substituents on the triazine nucleus.

6. A process as claimed in claim 1, wherein said polymeric compound comprises a polyacetal of aliphatic aldehyde and diol units.

7. A process as claimed in claim 1, wherein said compound having an acid-cleavable group comprises bis-(5-butyl-5-ethyl-1,3-dioxan-2-yl)-ether of 2-butyl-2-ethyl-propane-1,3-diol.

8. A process as claimed in claim 1, wherein said compound having an acid-cleavable group comprises a polyacetal of n-pentanal and triethylene glycol.

9. A process as claimed in claim 1, wherein said compound having an acid-cleavable group comprises a polymeric ortho carboxylic acid ester, prepared by condensing trimethyl ortho formate with 4-oxa-6,6-bis-hydroxymethyl oxtan-1-ol.

* * * * *